United States Patent
Henkel

(10) Patent No.: US 9,706,681 B2
(45) Date of Patent: Jul. 11, 2017

(54) MODULAR ELECTRONIC SYSTEM

(71) Applicant: WAGO Verwaltungsgesellschaft mbH, Minden (DE)

(72) Inventor: Marco Henkel, Minden (DE)

(73) Assignee: WAGO VERWALTUNGSGESELLSCHAFT MBH, Minden (DE)

( * ) Notice: Subject to any disclaimer, the term of this patent is extended or adjusted under 35 U.S.C. 154(b) by 101 days.

(21) Appl. No.: 14/607,512

(22) Filed: Jan. 28, 2015

(65) Prior Publication Data

US 2015/0216075 A1 Jul. 30, 2015

(30) Foreign Application Priority Data

Jan. 28, 2014 (DE) .................. 10 2014 201 483

(51) Int. Cl.
*H05K 7/20* (2006.01)
*H01L 23/467* (2006.01)
(Continued)

(52) U.S. Cl.
CPC ....... *H05K 7/20127* (2013.01); *H01L 23/427* (2013.01); *H01L 23/467* (2013.01); *H05K 7/1465* (2013.01); *G06F 1/20* (2013.01)

(58) Field of Classification Search
CPC ................. H01L 23/467; H01L 23/427; H01L 23/3672; H01L 23/34; H01L 23/42;
(Continued)

(56) References Cited

U.S. PATENT DOCUMENTS 3,741,292 A * 6/1973 Aakalu .................. H01L 23/427
165/104.21
3,874,444 A * 4/1975 Perce .................. H05K 7/20545
165/122
(Continued)

FOREIGN PATENT DOCUMENTS

DE 10 2007 026 898 A1 5/2008

*Primary Examiner* — Adam B Dravininkas
(74) *Attorney, Agent, or Firm* — Renner, Otto, Boisselle & Sklar, LLP

(57) ABSTRACT

Modular electronic system 1 with convection cooling, comprising a plurality of electronic modules 10, 20, 30, that each comprise an air inlet opening 12, 22, 32, an air outlet opening 14, 24, 34 and an air space 11 within the electronic module 10, 20, 30, wherein the air space 11 is in air exchange with the air inlet opening 12, 22, 32 and the air outlet opening 14, 24, 34, wherein at least one of the electronic modules 10, 20, 30 is an electronic module to be cooled 10, one of the electronic modules 10, 20, 30 is a first adjacent electronic module 20, which is adjacent to a first side 16 of the electronic module to be cooled 10 and one of the electronic modules 10, 20, 30 is a second adjacent electronic module 30, which is adjacent to a second side 18 opposite to the first side 16 of the electronic module to be cooled 10, wherein the electronic modules 10, 20, 30 are designed in such a manner that air can enter into the first adjacent electronic module 20, generate an air stream 11 for cooling within the air space 11 of the electronic module to be cooled 10 and exit heated from the second adjacent electronic module 30.

13 Claims, 3 Drawing Sheets

(51) Int. Cl.
*H01L 23/427* (2006.01)
*H05K 7/14* (2006.01)
*G06F 1/20* (2006.01)

(58) Field of Classification Search
CPC ... H01L 23/367; G06F 1/20; G06F 2200/201; G06F 1/181; G06F 1/1632; H05K 7/20745; H05K 7/20836; H05K 7/20727; H05K 7/20809; H05K 7/20409; H05K 7/20418; H05K 7/20436; H05K 7/20772; H05K 7/20145; H05K 7/20; H05K 7/20009; H05K 7/20127; H05K 7/20545; H05K 7/20709; H05K 7/1488
USPC ... 361/676–678, 679.46, 688–690, 692–693, 361/730–732, 735
See application file for complete search history.

(56) References Cited

U.S. PATENT DOCUMENTS

| | | | | |
|---|---|---|---|---|
| 5,335,144 | A * | 8/1994 | Maroushek | H05K 7/20136 165/122 |
| 5,513,071 | A * | 4/1996 | LaViolette | H05K 7/20545 165/80.3 |
| 6,336,691 | B1 * | 1/2002 | Maroney | H05K 7/20127 312/213 |
| 8,257,156 | B2 * | 9/2012 | Shabany | H05K 7/20572 361/695 |
| 2003/0081381 | A1 * | 5/2003 | Moizer | H05K 7/20572 361/690 |
| 2005/0286222 | A1 * | 12/2005 | Lucero | H05K 7/20563 361/690 |
| 2007/0206353 | A1 * | 9/2007 | Boone | H05K 7/20727 361/694 |
| 2007/0217157 | A1 * | 9/2007 | Shabany | H05K 7/20572 361/701 |
| 2007/0264921 | A1 * | 11/2007 | Letourneau | H05K 7/20009 454/1 |
| 2010/0188815 | A1 * | 7/2010 | Yamagiwa | H05K 7/20127 361/692 |
| 2013/0050942 | A1 * | 2/2013 | Konishi | H05K 7/20145 361/692 |

* cited by examiner

MODULAR ELECTRONIC SYSTEM

This application claims priority of German Application No. 10 2014 201 483.2 filed Jan. 28, 2014, which is hereby incorporated herein by reference.

FIELD OF THE INVENTION

The present invention relates to a modular electronic system with convection cooling.

BACKGROUND

Electronic modules, in particular in the control technology, comprise circuit boards, so called "printed circuit boards" which are used for electronic connection and mechanical fixation of electronic components. These circuit boards are often used in small housings in the control technology, which protect the electronics arranged therein and serve as fixation.

The electronic components are usually densely packed within the electronic modules for reasons of space. However, the electronic components of the electronic modules generate heat by their electrical power, which has to be dissipated so that no overheating of the electronic modules follows. Thus, a heat management is necessary in the electronic components which dissipates the generated heat.

Therefore, heat sinks and electronic fans are installed in the electronic modules for heat dissipation in many cases.

The patent specification EP 1 149 520 B1 discloses a circuit board which is arranged in a chassis, so that the generated heat is dissipated by heat conduction through a cooling wall of the chassis. Thereby, particular mechanical arrangements of the circuit board and the heat-conductive components are necessary.

The utility model document DE 20 2006 008 792 U1 discloses a solar inverter with two housing parts, wherein the electronic component is arranged in one housing part and the other housing part is designed as heat sink. Thereby, the electronic component is in direct thermal contact with the heat sink, which is cooled by convection.

However, the electronic modules are comparably small in many applications in the field of control technology, for example they are just a few millimeters wide, so that an installation of heat sinks and fans is very difficult.

The European patent specification EP 1 906 721 B1 discloses an electronic module with a heat sink, which is designed as housing part and which is in heat-conductive contact with the electronics.

However, the cooling of the electronic modules remains a problem that has not been optimally solved yet. Said heat management-solutions of the prior art require individual and thus cost-intensive components, such as for example particular heat sinks.

No particular heat management-solution is known so far for systems, which are installed by a plurality of geometrically similar electronic modules and as used in the control technology. Here, in particular the problem arises that the single modules of such a system comprise just small exposed exterior surfaces which can dissipate heat. Thus, solutions with heat sinks are not suitable.

It is therefore the problem of the present invention to provide a modular electronic system, which provides a more efficient cooling for a high number of electronic modules connected with each other than the prior art.

SUMMARY OF THE INVENTION

The above mentioned problem is solved by a modular electronic system according to claim 1, an electronic module according to claim 12, as well as, a method for cooling of a modular electronic system according to claim 13.

In particular, the above mentioned problem is solved by a modular electronic system, comprising a plurality of electronic modules, that each comprise an air inlet opening, an air outlet opening and an air space within the electronic module, wherein the air space is in air exchange with the air inlet opening and the air outlet opening, wherein at least one of the electronic modules is an electronic module to be cooled, one of the electronic modules is a first adjacent electronic module, which is adjacent to a first side of the electronic module to be cooled and one of the electronic modules is a second adjacent electronic module, which is adjacent to a second side opposite to the first side of the electronic module to be cooled, wherein the electronic modules are designed in such a manner that air can enter into the first adjacent electronic module, generate an air stream for cooling within the air space of the electronic module to be cooled and exit heated from the second adjacent electronic module.

The system according to the invention comprises a layered structure composed of several electronic modules with an air inlet- and air outlet opening for heat management, respectively. The electronic module to be cooled is adjacent to opposite sides on two adjacent electronic modules in this arrangement. The electronic modules according to the invention are designed that air can enter into a first adjacent (e.g. lower) electronic module, absorb the heat of the electronic components in the air space of the electronic module to be cooled and exit heated from a second adjacent (e.g. upper) electronic module. Thus, the height difference between the air inlet and the air outlet is increased in a horizontal installation position, which leads to the generation of an air stream within the (intermediate) electronic module to be cooled in a reliable manner as a result of natural convection, which cools this electronic module. Thus, the thereby generated cooling air duct is not just limited to the single electronic module, but is extended by the adjacent electronic modules, which decisively improves the thermal convection.

This is particularly advantageous, if the electronic modules are designed very narrow and comprise for example a thickness of just 8-50 mm, in particular 10-20 mm and preferably 12 mm. The electronic modules are preferably connectable with each other and each preferably comprise the inlet- and outlet opening of the cooling air at the opposite front sides of the respective longer sides of the housing.

In contrast to the prior art, thereby, no additional cooling components, such as heat sinks or fans are necessary. Such additional components which bring costs, noises, energy consumption and repairs along can be saved.

Preferably, the air stream is generated by natural convection, in particular by an increased temperature within the electronic module to be cooled and by a height difference between air inlet into the first adjacent electronic module and air outlet from the second adjacent electronic module.

Preferably, the electronic modules comprise a flat design and the electronic modules are adjacent to each other on the flat sides. The layered structure of stacked and flat electronic modules has proved to be advantageous in respect of scalability and space requirements. A cooling air duct can be generated by the direct mechanical contact of the electronic modules, which extends over several electronic modules and which improves the cooling of the respective electronic modules.

Preferably, the first adjacent electronic module is arranged below the electronic module to be cooled and the second adjacent electronic module is arranged above the electronic module to be cooled. It has proved to be advantageous in the layered structure of the electronic mules that the (intermediate) electronic module to be cooled is arranged between a lower and an upper electronic module. Thus, the air can flow from the bottom to the top as a result of thermal convection by entering in the lower electronic module, flowing through the intermediate electronic module and exiting again heated from the upper electronic module.

Preferably, each electronic module further comprises an air inlet for absorbing cool air from the environment, an air transferring opening for transferring the cool air to an adjacent electronic module, wherein the air transferring opening is in air exchange with the air inlet, an air absorbing opening for absorbing heated air from another adjacent electronic module, an air outlet for emitting heated air to the environment, wherein the air outlet is in air exchange with the air absorbing opening. The single electronic modules advantageously comprise additionally four air openings, thus six air openings in total.

Cool fresh air is absorbed through the air inlet of an electronic module (e.g. of a lower electronic module) and is transferred through the air transferring opening to an (e.g. intermediate) electronic module to be cooled. There, the fresh air enters through the air inlet opening into the air space. There, the cool fresh air absorbs heat from the electronic components. The thereby warm air of the electronic module to be cooled is emitted through the air outlet opening to an adjacent (e.g. overlying) electronic module. There, the warm air enters through an air absorbing opening into the electronic module and is emitted through the air outlet of this electronic module to the environment.

Preferably, each electronic module further comprises a flat housing. They can be arranged on top of each other in a compact and space-saving manner by means of the flat design of the single electronic modules in a flat housing.

Preferably, the air inlet is arranged on a first narrow side of the housing and the air outlet is arranged on a second narrow side, which is opposite to the first narrow side. The air transferring opening is preferably arranged on a first wide side of the housing and the air absorbing opening is arranged on the second wide side, which is opposite to the first wide side. The single electronic modules comprise among others two wide sides and two narrow sides by the flat housing. The air inlet and air outlet are arranged on the narrow sides. The air transferring opening and the air absorbing opening are arranged on the wide sides. Thus, the transfer of the air streams from adjacent electronic modules to each other is possible.

Preferably, each electronic module further comprises fixation means for directly fixating the electronic module to an adjacent electronic module. The electronic modules can thus be directly fixated to each other. Thus, a cooling air duct can be generated in an easy manner, which extends over several electronic modules. Further, it is ensured that the electronic modules are reliably and stably connected with each other and thus are not uncontrolledly displaced relative to one another during operation, which could interrupt the generated cooling air ducts. The electronic modules can be connected with each other and disconnected from each other in an easy and fast manner by means of the fixation means, preferably without tool usage.

Preferably, the electronic modules can be arranged to each other in any order. The electronic modules are arranged compatible and identical to each other in respect of the air openings and airflow, so that they can be stacked in any order in the system.

Preferably, the modular electronic system is arbitrarily exchangeable and/or extendable by means of electronic modules. One or more single electronic modules can be exchanged easily and quickly, arranged in another order and added to the system, for example be repaired or exchanged by one or more new ones. Thereby, the modular electronic system is arbitrarily configurable and scalable.

Preferably, the electronic modules do not comprise a fan. The air stream within the electronic module to be cooled is generated solely thermal. No additional fans are required, which would cause additional noises and costs and which require maintenance.

The above mentioned problem is also solved by an electronic module for a modular electronic system with convection cooling, in particular for an above mentioned modular electronic system, comprising an air inlet opening, an air outlet opening and an air space within the electronic module, wherein the air space is in air exchange with the air inlet opening and the air outlet opening, wherein the electronic module comprises a first side, with which it can be adjacent to a first electronic module, the electronic module comprises a second side, which is opposite to the first side, with which it can be adjacent to a second electronic module, the air inlet opening is arranged on the first side in such a manner that the electronic module can absorb air through the first adjacent electronic module from the environment and the air outlet opening is arranged on the second side in such a manner that the electronic module can emit air through the second adjacent electronic module to the environment, wherein an air stream for cooling can be generated in the air space within the electronic module.

Such an electronic module also provides the above described advantages of an improved cooling management of a modular electronic system built up from electronic modules. Thus, in particular, additional cooling elements, such as fans or heat sinks, are avoided.

The above mentioned problem is also solved by a method for cooling a modular electronic system by convection cooling. In particular, the above mentioned problem is solved by a method for cooling a modular electronic system by convection cooling, wherein the modular electronic system comprises a plurality of electronic modules, which each comprise an air inlet opening, an air outlet opening and an air space within the electronic module, wherein the air space is in air exchange with the air inlet opening and the air outlet opening and wherein a first electronic module is adjacent to a first side of an electronic module to be cooled and a second electronic module is adjacent to a second side, which is opposite to the first side; wherein the method comprises the following steps:

a. Entering of air into the first adjacent electronic module;
b. Transferring the air from the first adjacent electronic module to the electronic module to be cooled;
c. Generating an air stream for cooling within the air space of the electronic module to be cooled;
d. Transferring the heated air from the electronic module to be cooled to the second adjacent electronic module;
e. Emitting the air from the second adjacent electronic module.

There are also the above described advantages of an improved cooling management of a modular electronic system. Thus, particularly, additional cooling elements such as fans or heat sinks are avoided.

Further preferred embodiments of the invention are described in the dependent claims.

BRIEF DESCRIPTION OF THE DRAWINGS

In the following preferred embodiments of the invention are described with reference to the accompanying drawings.

DESCRIPTION OF THE PREFERRED EMBODIMENTS

In the following preferred embodiments of the present invention are described with reference to the accompanying figures. Features of single embodiments can be combined with those of other embodiments, as well, although such combinations are not illustrated in the individual case in detail.

Figure 1:
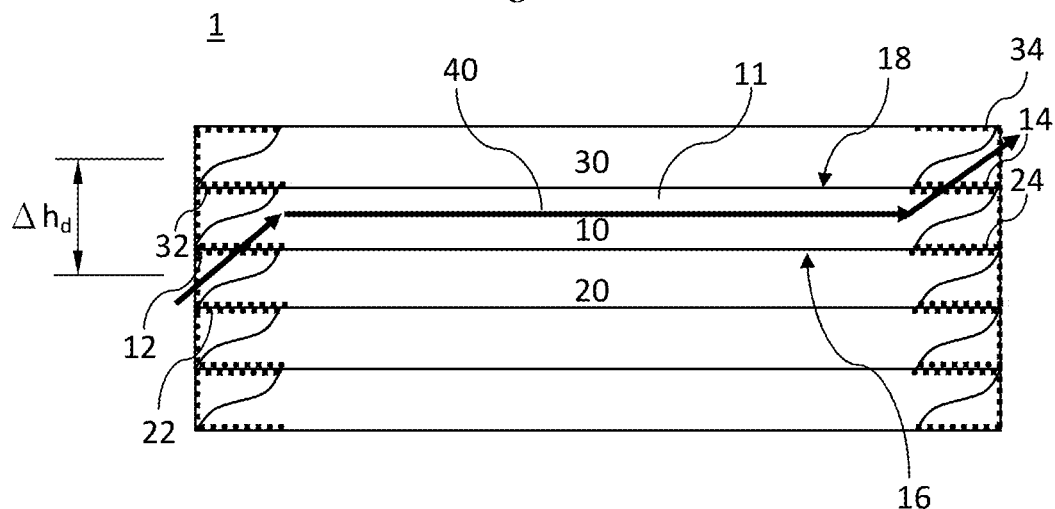
FIG. 1: a section front view of a preferred embodiment of the modular electronic system according to the invention.

FIG. 1 shows a modular electronic system 1 according to the invention with a multilayer structure of electronic modules 10, 20, 30. The electronic system 1 comprises five electronic modules 10, 20, 30 in the illustrated example. Each of the electronic modules 10, 20, 30 comprises and air inlet opening 12, 22, 32 and an air outlet opening 14, 24, 34.

Preferably, an electronic module 10, 20, 30 comprises at least one circuit board 17 with electronic components or component parts and contacts for electronic connection, which are not illustrated.

The electronic modules 10, 20, 30 further comprise a housing 13, which surrounds the circuit board 17 with the electronic components. The electronic modules 10, 20, 30 are preferably designed flat in order to occupy little space. Since the electronic modules 10, 20, 30 are mainly arranged geometrically similar they can be stacked on top of each other in a modular electronic system 1, as illustrated in FIG. 1.

A first (lower) adjacent electronic module 20 is adjacent to a first, lower side 16 of an (intermediate) electronic module to be cooled 10. A second (upper) adjacent electronic module 30 is adjacent to a second, upper side 18 of the (intermediate) electronic module to be cooled 10.

The arrangement, in particular, the order of the electronic modules 10, 20, 30 can be changed, since the electronic modules 10, 20, 30 are designed mainly identical in respect of their air openings. For example, the (intermediate) electronic module to be cooled 10 can be exchanged with the adjacent (upper) electronic module 30. Thus, the new intermediate electronic module 30 becomes the electronic module to be cooled. It goes without saying that each electronic module in the illustrated electronic system 1 situated between two adjacent electronic modules is an electronic module to be cooled in the sense of the invention.

As exemplary illustrated by the air stream or air passage 40, respectively, in FIG. 1, the electronic modules 10, 20, 30 are arranged that cool air can enter from the environment into the first adjacent electronic module 20. Then, this air enters in the air space 11 of the electronic module to be cooled 10 and generates an air stream 40 there for cooling the electronic components 17. Then, the heated air is transferred to the second adjacent electronic module 30 and exits from this into the environment again. Thereby, an average height difference $\Delta h_d$ of the air arises as a result, which enters into the lower electronic module 20 and exits from the upper electronic module 30. Thus, the height difference $\Delta h_d$ of the air passage 40 is increased on average twofold and maximal threefold in comparison to a single electronic module. A thermal stream is generated which reliably cools the electronic module 10 by means of this significant increase of the height difference $\Delta h_d$ of the air passage 40 over the electronic modules 10, 20, 30 and by the increased temperature within the electronic module to be cooled 10. Thereby, the air flows from the bottom to the top by entering into the lower adjacent electronic module 20, flowing through the electronic module to be cooled 10 and exiting from the upper electronic module 30.

Figure 2:
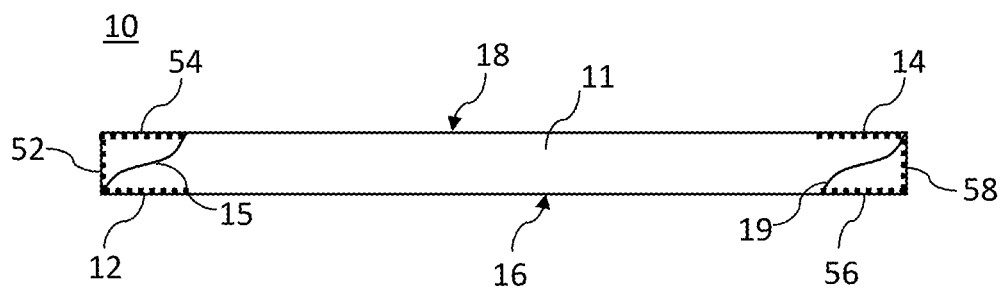
FIG. 2: a section front view of a preferred embodiment of a single electronic module.

FIG. 2 shows a section front view of the (intermediate) electronic module to be cooled 10. The electronic module 10 comprises preferably six distinct air openings in total: an air inlet 52 on the narrow side of the electronic module 10 for absorbing cool fresh air from the environment. This cool fresh air is conducted through an air transferring opening 54 on the upper wider side 18 of the electronic module 10 to an overlying electronic module. Therefore, the electronic module 10 comprises preferably a curved air-conducting surface 15, which conducts the air accordingly from the air inlet 52 to the air transferring opening 54.

Furthermore, the electronic module 10 comprises an air absorbing opening 56 on the lower wider side 16 for absorbing the heated air from an adjacent electronic module. This heated air is conducted through a further air-conducting surface 19 to an air outlet 58 from which the heated air is emitted to the environment.

Finally, the electronic module comprises an air inlet opening 12 on its lower wider side 16, through which the cool fresh air from the air transferring opening 54 of an underlying adjacent electronic module can enter into the air space 11 within the housing 13 of the electronic module 10. The fresh air flows through the air space 11 in which the electronic components 17 are situated and thereby warms up. The thereby heated air exits on the other side of the air space 11 through an air outlet opening 14 on the upper wider side 18 of the electronic module 10 and enters into the air transferring opening 56 of an overlying electronic module. The convection of the air over the electronic components is optimized by the preferred arrangement of the air openings.

Figure 3:
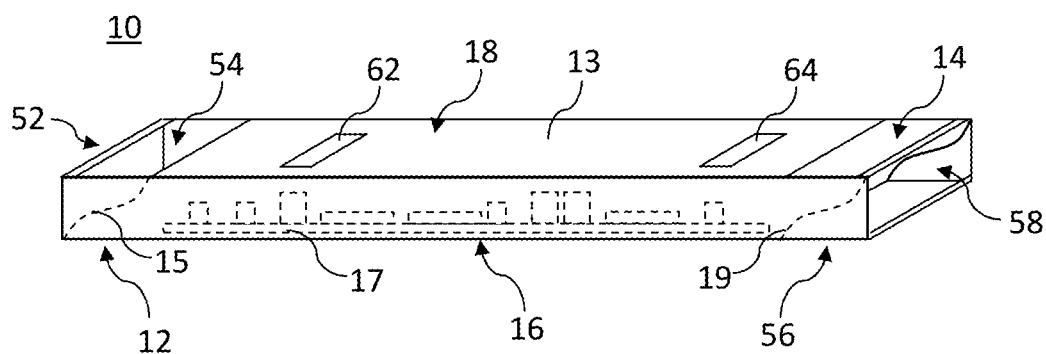
FIG. 3: a perspective view of an embodiment of a single electronic module with air openings and fixation means.

FIG. 3 shows a perspective view of an embodiment of an (intermediate) electronic module to be cooled 10, wherein the therein integrated circuit boards 17 with the according electronic components are shown dashed. The electronic module 10 comprises a flat housing 13. Fixation means 62, 64 are arranged on the upper wider side of the housing 13. The single electronic modules 10, 20, 30 can be connected with each other and disconnected from each other by means of the fixation means 62, 64 without tool usage. The fixation means according to the fixation means 62, 64 (not illustrated) are arranged on the lower wider side of each electronic module 10, 20, 30. The electronic modules 10, 20, 30 can be slided on top of each other and are thus mechanically connected with each other by means of rail-like fixation means 62, 64 and according fixation means on the lower side. In particular, the electronic modules are directly adjacent to each other, so that the air transferring openings 54 are directly opposite to the air inlet openings 12, as well as, the air outlet openings 14 are directly opposite to the air transferring openings 56 of according adjacent electronic modules. The upper- and lower sides 16, 18 of the electronic module are designed mainly smoothly, so that the slot between the electronic modules 10, 20, 30 can be minimized. Thus, the air exchange between the air openings 12, 14, 54, 56 can be optimized.

Figure 4:
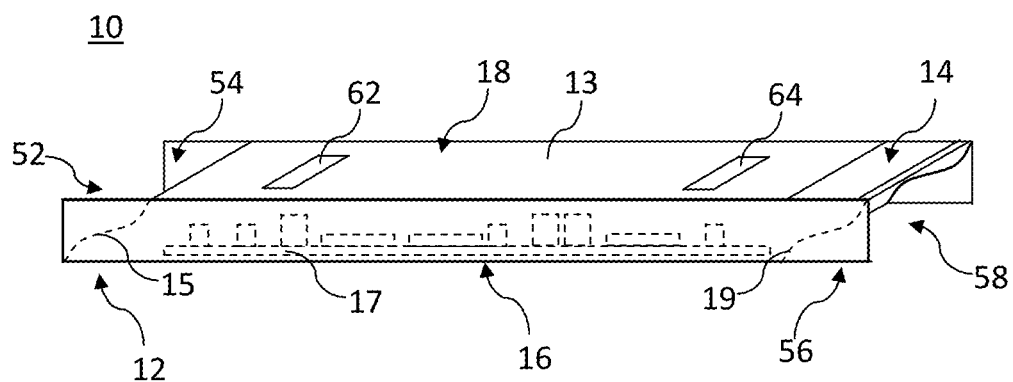
FIG. 4: a perspective view of another embodiment of a single electronic module with air openings and fixation means.

FIG. 4 shows compared to FIG. 3 an embodiment of an electronic module 10, wherein the air inlet 52 is structurally not separated from the air transferring opening. In the same way, the air absorbing opening 56 is not separated from the air outlet 58. Thereby, the cross section of the air inlet 52 and the air outlet 58 is maximized.

Figure 5A:
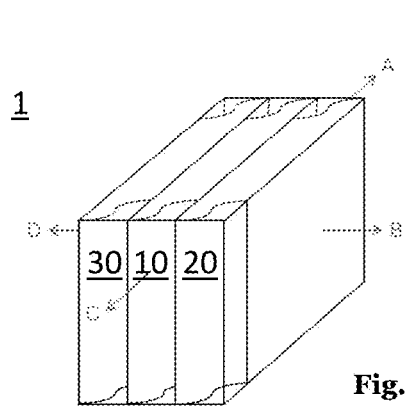
FIG. 5A-E: distinct views of a further embodiment of a modular electronic system according to the invention in distinct installation positions in space.

Furthermore, FIG. 5A shows the layered structure of the modular electronic system 1 of three electronic modules 10, 20, 30 in a three-dimensional view, wherein they and the respective sides of the electronic system 1 are denoted with their surface normals A, B, C and D. This notation for the sides is maintained in FIGS. 5A-E.

Figure 5B:
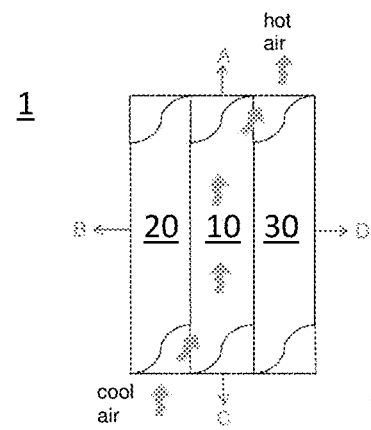

FIG. 5B shows a front view of this modular electronic system 1, wherein the electronic modules are vertically arranged in space. The air passage for cooling of the electronic module 10 is indicated by upward arrows. A cooling air stream is generated over the electronic modules 10, 20, 30 by natural convection, as well, in this spatial arrangement, wherein the cool air enters into the first adjacent electronic module 20, flows through the electronic module to be cooled 10 and exits heated from the second adjacent electronic module 30.

Figure 5C:
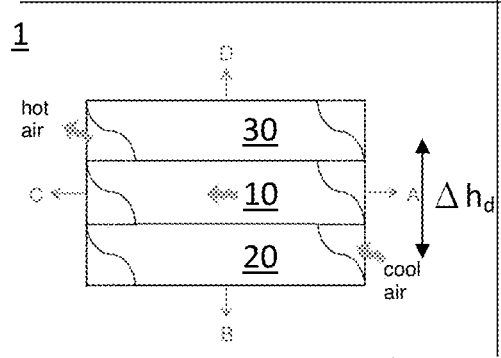
Figure 5D:
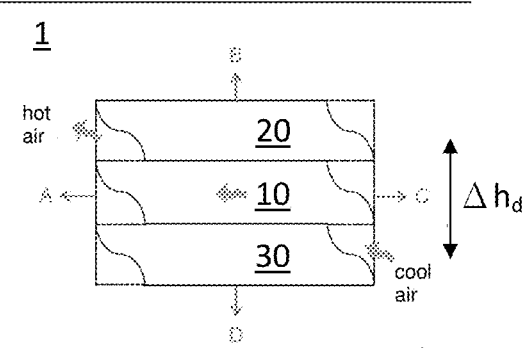

FIG. 5C shows the same modular electronic system 1 rotated by 90° in space and in FIG. 5D rotated by −90°. A natural convection is generated in both positions by the average height difference $\Delta h_d$ and the increased temperature in the electronic module 10, which is illustrated by the arrows.

In FIG. 5C, the cool air enters into the first adjacent electronic module 20, flows through the electronic module to be cooled 10 and exits heated from the second adjacent electronic module 30.

In FIG. 5D, the cool air, however, enters into the second adjacent electronic module 30, flows through the electronic module to be cooled 10 and exits heated from the first adjacent electronic module 20. Thereby, the air inlet- and air outlet openings are interchanged in respect of the installation position in FIGS. 5B and 5C. Thus, the air inlet openings become air outlet openings and the air outlet openings become air inlet openings depending on the installation position.

Figure 5E:
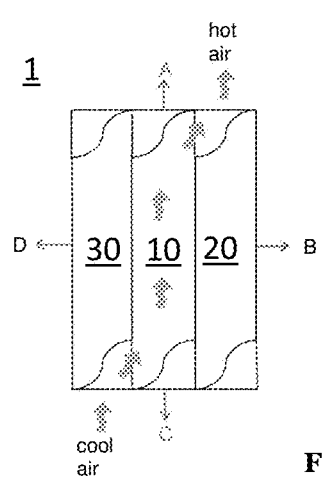

FIG. 5E shows the same modular electronic system 1 in an installation position, which is rotated by 180° in space in respect of FIG. 5B, as can be seen by the surface normals A, B, C and D. In this installation position, the cool air enters into the second adjacent electronic module 30, flows through the electronic module to be cooled 10 and exits heated from the first adjacent electronic module 20. Thus, a sufficient cooling air stream is set up through the module to be cooled 10 in each installation position for the sole reason of thermal convection.

A method for cooling of a modular electronic system arises as result of the above described arrangement of the electronic modules 10, 20, 30, which comprises the following steps:
a. Entering of air into the first adjacent electronic module 20 (in FIG. 5D and FIG. 5E into the second adjacent electronic module 30);
b. Transferring the air from the first adjacent electronic module 20 (in FIG. 5D and FIG. 5E from the second adjacent electronic module 30) to the electronic module to be cooled 10;
c. Generating an air stream 40 for cooling within the air space 11 of the electronic module to be cooled 10;
d. Transferring the heated air from the electronic module to be cooled 10 to the second adjacent electronic module 30 (in FIG. 5D and FIG. 5E to the first adjacent electronic module 20); and
e. Emitting the air from the second adjacent electronic module 30 (in FIG. 5D and FIG. 5E from the first adjacent electronic module 30).

The natural convection is optimized and can thus be solely used for cooling of an electronic module by this method.

REFERENCE LIST 1 modular electronic system
10 electronic module to be cooled
11 air space
12 air inlet opening (air outlet opening in another installation position)
13 housing
14 air outlet opening (air inlet opening in another installation position)
15 air-conducting surface
16 first side of the electronic module
17 electronic components, circuit board
18 second side of the electronic module
19 air-conducting surface
20 a first adjacent electronic module
22 air inlet opening (air outlet opening in another installation position)
24 air outlet opening (air inlet opening in another installation position)
30 second adjacent electronic module
32 air inlet opening (air outlet opening in another installation position)
34 air outlet opening (air inlet opening in another installation position)
40 air stream
52 air inlet
54 air transferring opening (air absorbing opening in another installation space)
56 air absorbing opening (air transferring opening in another installation space)
58 air outlet
62, 64 fixation means

The invention claimed is:
1. Modular electronic system with convection cooling, comprising:
 a. a plurality of electronic modules, that each comprise an air inlet opening, an air outlet opening and an air space within the electronic module, wherein the air space is in air exchange with the air inlet opening and the air outlet opening; wherein
 b. at least one of the electronic modules is an electronic module to be cooled;
 c. one of the electronic modules is a first adjacent electronic module, which is adjacent to a first side of the electronic module to be cooled; and
 d. one of the electronic modules is a second adjacent electronic module, which is adjacent to a second side opposite to the first side of the electronic module to be cooled; wherein
 e. the electronic modules are designed in such a manner that air can enter into the first adjacent electronic module, generate an air stream for cooling within the air space of the electronic module to be cooled and exit heated from the second adjacent electronic module; and wherein f. the air stream is generated by natural convection by an increased temperature within the electronic module to be cooled and by a height difference between air inlet into the first adjacent electronic module and air outlet from the second adjacent electronic module; and g. the height difference is on average at least twice the height of a single electronic module.

2. Modular electronic system according to claim 1, wherein the electronic modules comprise a flat design and the electronic modules are adjacent to each other on their upper and lower sides, respectively.

3. Modular electronic system according to claim 2, wherein the first adjacent electronic module is arranged below the electronic module to be cooled and the second adjacent electronic module is arranged above the electronic module to be cooled.

4. Modular electronic system according to claim 1, wherein each electronic module further comprises:
  a. an air inlet for absorbing cool air from the environment;
  b. an air transferring opening for transferring the cool air to an adjacent electronic module, wherein the air transferring opening is in air exchange with the air inlet;
  c. an air absorbing opening for absorbing heated air from another adjacent electronic module;
  d. an air outlet for emitting heated air to the environment, wherein the air outlet is in air exchange with the air absorbing opening.

5. Modular electronic system according to claim 1, wherein each electronic module further comprises a flat housing.

6. Modular electronic system according to claim 5, wherein
  a. the air inlet is arranged on a first narrow side of the housing and the air outlet is arranged on a second narrow side, which is opposite to the first narrow side; and
  b. the air absorbing opening is arranged on the first lower side of the housing and the air transferring opening is arranged on the second upper side, which is opposite to the first lower side.

7. Modular electronic system according to claim 1, wherein each electronic module further comprises fixation means for directly fixing an electronic module to an adjacent electronic module.

8. Modular electronic system according to claim 1, wherein the electronic modules can be arranged to each other in any order.

9. Modular electronic system according to claim 1, wherein the modular electronic system is arbitrarily exchangeable and/or extendable by means of electronic modules.

10. Modular electronic system according to claim 1, wherein the electronic modules do not comprise a fan.

11. Electronic module for a modular electronic system with convection cooling, comprising:
  a. an air inlet opening, an air outlet opening and an air space within the electronic module, wherein the air space is in air exchange with the air inlet opening and the air outlet opening; wherein
  b. the electronic module comprises a first side, with which it can be adjacent to a first electronic module;
  c. the electronic module comprises a second side, which is opposite to the first side, with which it can be adjacent to a second electronic module;
  d. the air inlet opening is arranged on the first side in such a manner that the electronic module can absorb air through the first adjacent electronic module from the environment; and
  e. the air outlet opening is arranged on the second side in such a manner that the electronic module can emit air through the second adjacent electronic module to the environment; wherein
  f. an air stream for cooling can be generated in the air space within the electronic module; and
  g. the air stream is generated by natural convection by an increased temperature within the electronic module to be cooled and by a height difference between air inlet into the first adjacent electronic module and air outlet from the second adjacent electronic module; and
  h. the height difference is on average at least twice the height of a single electronic module.

12. Method for cooling of a modular electronic system by convection cooling, wherein the modular electronic system comprises a plurality of electronic modules, which each comprise an air inlet opening, an air outlet opening and an air space within the electronic module, wherein the air space is in air exchange with the air inlet opening and the air outlet opening;

wherein a first electronic module is adjacent to a first side of an electronic module to be cooled and a second electronic module is adjacent to a second side, which is opposite to the first side;

wherein the method comprises the following steps:
  a. entering of air into the first adjacent electronic module;
  b. transferring the air from the first adjacent electronic module to the electronic module to be cooled;
  c. generating an air stream for cooling within the air space of the electronic module to be cooled;
  d. the air stream is generated by natural convection by an increased temperature within the electronic module to be cooled and by a height difference between air inlet into the first adjacent electronic module and air outlet from the second adjacent electronic module; and
  e. the height difference is on average at least twice the height of a single electronic module;
  f. transferring the heated air from the electronic module to be cooled to the second adjacent electronic module;
  g. emitting the air from the second adjacent electronic module.

13. Method according to claim 12, wherein the electronic modules comprise a flat design and the electronic modules are adjacent to each other on their upper and lower sides, respectively.

* * * * *